United States Patent
Cheng et al.

(10) Patent No.: US 6,787,375 B2
(45) Date of Patent: Sep. 7, 2004

(54) MICROELECTRONIC FABRICATION DIE ELECTRICAL TEST METHOD PROVIDING ENHANCED MICROELECTRONIC FABRICATION DIE ELECTRICAL TEST EFFICIENCY

(75) Inventors: Yung-Min Cheng, Yung Kang (TW); Yao-Tung Liu, Hsinchu (TW); Chun-Tsung Yang, Tainan (TW); Juei-Feng Hsu, Tainan (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/144,591

(22) Filed: May 13, 2002

(65) Prior Publication Data

US 2003/0211639 A1 Nov. 13, 2003

(51) Int. Cl.[7] .............................................. H01L 21/66
(52) U.S. Cl. ......................................... 438/14; 438/15
(58) Field of Search ................................. 438/14–16, 5, 438/10, 17

(56) References Cited

U.S. PATENT DOCUMENTS

| | | | |
|---|---|---|---|
| 5,585,737 A | | 12/1996 | Shibata |
| 5,872,360 A | * | 2/1999 | Paniccia et al. ......... 250/341.4 |
| 6,043,101 A | | 3/2000 | Stubblefield et al. |
| 6,054,868 A | * | 4/2000 | Borden et al. ............... 324/752 |
| 6,309,900 B1 | * | 10/2001 | Maury et al. .................. 438/16 |
| 6,324,481 B1 | | 11/2001 | Atchison et al. |
| 6,362,013 B1 | * | 3/2002 | Yoshimura .................... 438/14 |
| 6,383,824 B1 | * | 5/2002 | Lensing ........................ 438/14 |
| 6,392,229 B1 | * | 5/2002 | Dana et al. .................. 250/306 |
| 6,429,452 B1 | * | 8/2002 | Jarvis .......................... 257/48 |
| 6,498,502 B2 | * | 12/2002 | Edwards et al. ............ 324/750 |
| 6,537,833 B1 | * | 3/2003 | Lensing ....................... 438/14 |
| 6,551,844 B1 | * | 4/2003 | Eldridge et al. .............. 438/14 |
| 6,562,636 B1 | * | 5/2003 | Richmond et al. ............ 438/14 |
| 6,566,150 B2 | * | 5/2003 | Kohno et al. .................. 438/14 |
| 6,568,989 B1 | * | 5/2003 | Molnar .......................... 451/5 |
| 6,573,113 B1 | * | 6/2003 | Low et al. .................... 438/18 |
| 6,579,734 B2 | * | 6/2003 | Aoki ........................... 438/15 |

* cited by examiner

Primary Examiner—John F. Niebling
Assistant Examiner—Olivia T. Luk
(74) Attorney, Agent, or Firm—Tung & Associates

(57) ABSTRACT

Within a method for electrical testing a series of microelectronic fabrication die fabricated within a microelectronic fabrication substrate, there is first electrically tested the series of microelectronic fabrication die to determine at least one sub-series of electrically unacceptable microelectronic fabrication die. Similarly, there is also determined whether the microelectronic fabrication substrate may be reworked. Finally, there is also electrically retested only the at least one sub-series of electrically unacceptable microelectronic fabrication die, and only if the microelectronic substrate may be reworked. The method provides for enhanced efficiency when electrically testing the series of microelectronic fabrication die.

11 Claims, 2 Drawing Sheets

MICROELECTRONIC FABRICATION DIE ELECTRICAL TEST METHOD PROVIDING ENHANCED MICROELECTRONIC FABRICATION DIE ELECTRICAL TEST EFFICIENCY

CROSS-REFERENCE TO RELATED APPLICATIONS

This application is related to: (1) application Ser. No. 09/942,395, filed 29 Aug. 2001, now U.S. Pat. No. 6,440,757, issued 27 Aug. 2002; and (2) application Ser. No. 10/002,525, filed 25 Nov. 2001, each titled "Microelectronic Fabrication Die Electrical Probe Apparatus Electrical Test Method Providing Enhanced Microelectronic Fabrication Die Electrical Test Accuracy and Efficiency."

BACKGROUND OF THE INVENTION

1. Field of the Invention

The present invention relates generally to electrical test apparatus electrical test methods for electrically testing microelectronic fabrication die. More particularly, the present invention relates to electrical test apparatus electrical test methods for efficiently electrically testing microelectronic fabrication die.

2. Description of the Related Art

Microelectronic fabrications are formed from microelectronic substrates over which are formed patterned microelectronic conductor layers which are separated by microelectronic dielectric layers.

Integral to the fabrication of microelectronic fabrications, and in particular to the fabrication of semiconductor integrated circuit microelectronic fabrications, is the electrical testing of microelectronic fabrication die. The electrical testing of microelectronic fabrication die may occur: (1) during various stages incident to the ongoing fabrication of microelectronic fabrication substrates, as is generally understood to encompass in-line electrical testing of microelectronic fabrication die; as well as (2) subsequent to completion of fabrication of microelectronic fabrication substrates, as is generally understood to encompass final electrical testing of microelectronic fabrication die. Within either in-line electrical testing of microelectronic fabrication die or final electrical testing of microelectronic fabrication die there is typically and preferably employed an electrical test apparatus electrical test method which provides for electrical testing of various microelectronic devices and/or various microelectronic circuits within a plurality of microelectronic fabrication die fabricated within a microelectronic fabrication substrate.

While in-line electrical testing of microelectronic fabrication die and final electrical testing of microelectronic fabrication die while employing electrical test apparatus electrical test methods are both of considerable interest and of considerable importance to the goal of fabricating fully functional and fully reliable microelectronic fabrication die, both in-line electrical testing of microelectronic fabrication die and final electrical testing of microelectronic fabrication die while employing electrical test apparatus electrical test methods are nonetheless not entirely without problems with respect to the goal of fabricating fully functional and fully reliable microelectronic fabrication die. In that regard, both in-line electrical testing of microelectronic fabrication die and final electrical testing of microelectronic fabrication die while employing electrical test apparatus electrical test methods are often not entirely efficient when fabricating microelectronic fabrication die and often require a considerable expenditure of microelectronic fabrication processing resources, including but not limited to microelectronic fabrication cycle time processing resources, microelectronic fabrication tooling processing resources and microelectronic fabrication direct labor processing resources, when fabricating microelectronic fabrication die. Such electrical test testing inefficiency and considerable expenditure of microelectronic fabrication processing resources in turn increases in general microelectronic fabrication production costs when fabricating microelectronic fabrication die.

It is thus desirable in the art of microelectronic fabrication to provide electrical test methods for more efficiently electrically testing microelectronic fabrication die fabricated within microelectronic fabrication substrates.

It is towards the foregoing object that the present invention is directed.

Various methods, systems and apparatus for electrically testing microelectronic fabrications, such as to realize desirable results incident to electrically testing microelectronic fabrications, have been disclosed in the art of microelectronic fabrication.

Included among the methods, systems and apparatus, but not limited among the methods, systems and apparatus, are methods, systems and apparatus disclosed within: (1) Shibata, in U.S. Pat. No. 5,585,737 (an electrical probe apparatus electrical test method for electrically testing semiconductor integrated circuit microelectronic fabrication die within a semiconductor substrate while minimizing a number of times the semiconductor substrate must be indexed, by optimizing within the electrical probe apparatus electrical test method an index region of an electrical probe card with respect to the semiconductor substrate); (2) Stubblefield et al., in U.S. Pat. No. 6,043,101 (an electrical probe apparatus electrical test method which efficiently reduces a quantity of false electrical failures when electrically testing a series of semiconductor integrated circuit microelectronic fabrication die within a semiconductor substrate, by providing for an immediate retesting of an apparent electrically failed semiconductor integrated circuit microelectronic fabrication die prior to repositioning an electrical test apparatus electrical probe head employed for electrically testing the series of semiconductor integrated circuit microelectronic fabrication die); and (3) Atchison et al., in U.S. Pat. No. 6,324,481 (an electrical test apparatus electrical test method for determining yield limits when fabricating semiconductor integrated circuit microelectronic fabrication die, by: (1) generating a semiconductor substrate wafer map with respect to electrically tested semiconductor integrated circuit microelectronic fabrication die; (2) eliminating from the wafer map semiconductor integrated circuit microelectronic fabrication die which have multiple defects; and (3) predicting for semiconductor integrated circuit microelectronic fabrication die which have only single defects a probability that the single defects may be yield limiting with respect to the semiconductor integrated circuit microelectronic fabrication die).

Desirable in the art of microelectronic fabrication are additional electrical test methods which may be employed for more efficiently electrically testing microelectronic fabrication die fabricated within microelectronic fabrication substrates.

It is towards the foregoing object that the present invention is directed.

SUMMARY OF THE INVENTION

A first object of the present invention is to provide an electrical test method for electrically testing a series of microelectronic fabrication die fabricated within a microelectronic fabrication substrate.

A second object of the present invention is to provide an electrical test method in accord with the first object of the present invention, wherein the series microelectronic fabrication die is efficiently electrically tested.

A third object of the present invention is to provide an electrical test method in accord with the first object of the present invention and the second object of the present invention, wherein the electrical test method is readily commercially implemented.

In accord with the objects of the present invention, there is provided by the present invention an electrical test method for electrically testing a series of microelectronic fabrication die fabricated within a microelectronic fabrication substrate.

To practice the method of the present invention, there is first provided a microelectronic fabrication substrate having fabricated therein a series of microelectronic fabrication die. There is then electrically tested the series of microelectronic fabrication die while employing an electrical test apparatus, to thus define within the series of microelectronic fabrication die at least one sub-series of electrically unacceptable microelectronic fabrication die. There is also determined whether the microelectronic fabrication substrate may be reworked. Finally, there is also electrically retested within the microelectronic fabrication substrate only the at least one sub-series of electrically unacceptable microelectronic fabrication die, and only if the microelectronic fabrication substrate may be reworked.

There present invention provides an electrical test method for electrically testing a series of microelectronic fabrication die fabricated within a microelectronic fabrication substrate, wherein the series of microelectronic fabrication die fabricated within the microelectronic fabrication substrate is efficiently electrically tested.

The present invention realizes the foregoing object by employing an electrical test apparatus electrical test method which provides, when electrically testing a series of microelectronic fabrication die within a microelectronic substrate, for: (1) determining whether the microelectronic fabrication substrate may be reworked; and (2) electrically retesting within the microelectronic fabrication substrate only at least one sub-series of electrically unacceptable microelectronic fabrication, and only if the microelectronic fabrication substrate may be reworked.

The method of the present invention is readily commercially implemented. The present invention employs apparatus and systems as are generally known in the art of microelectronic fabrication, but employed at least in part within the context of a novel methodology which provides at least in part the present invention. Since it is thus at least in part a specific and novel methodology which provides at least in part the present invention, rather than the existence of specific apparatus and systems which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides an electrical test method for electrically testing a series of microelectronic fabrication die fabricated within a microelectronic fabrication substrate, wherein the series of microelectronic fabrication die fabricated within the microelectronic fabrication substrate is efficiently electrically tested.

The present invention realizes the foregoing object by employing an electrical probe apparatus electrical test method which provides, when electrically testing a series of microelectronic fabrication die within a microelectronic substrate, for: (1) determining whether the microelectronic fabrication substrate may be reworked; and (2) electrically retesting within the microelectronic fabrication substrate only at least one sub-series of electrically unacceptable microelectronic fabrication die, and only if the microelectronic fabrication substrate may be reworked.

Although the present invention and preferred embodiment of the present invention provides particular value when electrically testing, with enhanced efficiency, a series of semiconductor integrated circuit microelectronic fabrication die within a semiconductor substrate, the present invention is not so limited. Rather, the present invention may be employed for electrically testing, with enhanced efficiency, various series of microelectronic fabrication die fabricated within various microelectronic fabrication substrates employed within various microelectronic fabrications, including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Figure 1:
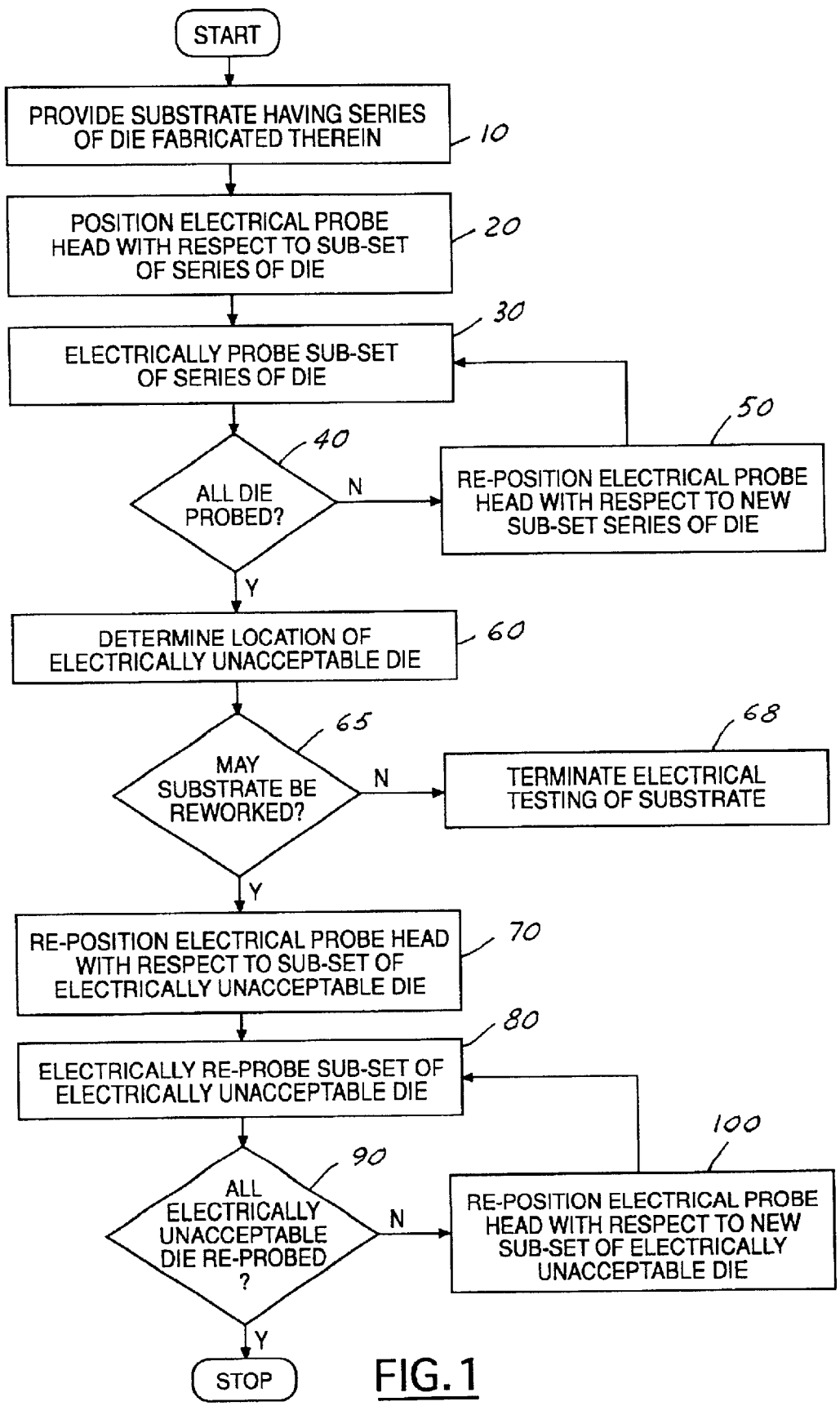
FIG. 1 shows an algorithmic flow diagram illustrating a preferred embodiment of the method of the present invention.

Referring now to FIG. 1, there is shown an algorithmic flow diagram illustrating a preferred embodiment of the method of the present invention.

Shown in FIG. 1, and in accord with the block which corresponds with reference numeral 10, there is first provided a microelectronic fabrication substrate having fabricated therein a series of microelectronic fabrication die.

Within the preferred embodiment of the present invention, and in general in accord with the disclosure above, the microelectronic fabrication substrate may be employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications. More preferably, and in specific in accord with the disclosure above, the present invention is more preferably employed with respect to electrically testing a series of semiconductor integrated circuit microelectronic fabrication die fabricated within a semiconductor substrate.

Referring again to FIG. 1, and in accord with the block which corresponds with reference numeral 20, the microelectronic fabrication substrate having fabricated therein the series of microelectronic fabrication die is then positioned within an electrical test apparatus wherein there is positioned with respect to a sub-set of the series of microelectronic fabrication die an electrical probe head which also comprises the electrical test apparatus.

Within the preferred embodiment of the present invention with respect to the electrical test apparatus and the electrical probe head, the electrical test apparatus and the electrical probe head may be of a construction as is otherwise generally conventional in the art of microelectronic fabrication, including but not limited to a construction which provides a physical contact of the electrical probe head with the sub-set of the series of microelectronic fabrication die and a construction which provides a non-physical (i.e., inductive) contact of the electrical probe head with the sub-set of the series of microelectronic fabrication die.

Similarly, within the preferred embodiment of the present invention with respect to the sub-set of the series of microelectronic fabrication die with respect to which the electrical probe head within the electrical test apparatus is positioned, although the sub-set of the series of microelectronic fabrication die is typically and preferably a single microelectronic fabrication die, the present invention also contemplates an electrical probe head sized and fabricated such as to accommodate a simultaneous electrical testing of more than one microelectronic fabrication die.

Referring again to FIG. 1, and in accord with the block which corresponds with reference numeral 30, there is then electrically tested while employing the electrical test apparatus the sub-set of the series of microelectronic fabrication die. Such electrical testing while employing the electrical test apparatus of the sub-set of the series of microelectronic fabrication die may be undertaken within the context of electrical test parameters as are otherwise also generally conventional in the art of electrical testing of microelectronic fabrication die, such electrical test parameters including but not limited to electrical opens, electrical shorts, electrical leakage currents and microelectronic device threshold voltages.

Referring again to FIG. 1, and in accord with the inquiry block which corresponds with reference numeral 40, there is then determined if each of the microelectronic fabrication die within the series of microelectronic fabrication die has been electrically tested.

If each of the microelectronic fabrication die within the series of microelectronic fabrication die has not been electrically tested, and in accord with a repetitive loop which includes the blocks which correspond with reference numeral 50, reference numeral 30 and reference numeral 40, the electrical probe head within the electrical probe apparatus is repetitively repositioned to a new sub-set of the series of microelectronic fabrication die and the new sub-sets of the series of microelectronic fabrication die is electrically tested until such time as all of the series of microelectronic fabrication die have been electrically tested.

Referring again to FIG. 1, and in accord with the block which corresponds with reference numeral 60, and as a result of electrical testing of each of the series of microelectronic fabrication die, there is determined a location within the microelectronic fabrication substrate of at least one sub-series of electrically unacceptable microelectronic fabrication die. In that regard, the number of sub-series of electrically unacceptable microelectronic fabrication die will typically and preferably correspond with a number of different types of electrical failure modes within the electrically unacceptable microelectronic fabrication die.

Referring again to FIG. 1 and in accord with the inquiry block which corresponds with reference numeral 65, there is then determined whether the microelectronic fabrication substrate may be reworked.

Within the present invention and the preferred embodiment of the present invention, a determination of rework feasibility of a microelectronic fabrication substrate is generally determined as an engineering decision and is generally made for a specific product type of microelectronic fabrication substrate, to allow for none or any of a specific number of rework procedures and cycles to be performed with respect to the microelectronic fabrication substrate, subsequent to which no additional rework procedures and cycles are allowed for the microelectronic fabrication substrate or the microelectronic fabrication die fabricated therein. While a definition of rework feasibility of a microelectronic fabrication substrate is thus at least in part somewhat of an arbitrary determination made with enlightened engineering judgment and intervention, it is nonetheless a significant determination within the context of the present invention and the preferred embodiment of the present invention.

Referring again to FIG. 1, and if the microelectronic substrate may not be reworked, and further in accord with the block which corresponds with reference numeral 68, electrical testing of the substrate is terminated and no additional manufacturing resource is expended in electrical testing of the microelectronic substrate. At this point, and depending upon a percentage of electrically unacceptable die found within the microelectronic substrate, the microelectronic substrate may be either scrapped (if a yield of electrically acceptable microelectronic fabrication die is particularly low (i.e., generally less than about 20 percent)) or further processed absent additional electrical testing (if a yield of electrically acceptable microelectronic fabrication die is generally high (i.e., generally greater than about 80 percent)).

Referring again to FIG. 1, and if the microelectronic fabrication may be reworked, and further in accord with the blocks which correspond with reference numeral 70 and reference numeral 80, there is then repositioned the electrical probe head with respect to a sub-set of the sub-series of electrically unacceptable microelectronic fabrication die and electrically retested the sub-set of the sub-series of electrically unacceptable microelectronic fabrication die.

Similarly, with the initial electrical testing of the multiple sub-sets of the series of microelectronic fabrication die in accord with the blocks which correspond with reference numerals 20, 30, 40 and 50, within the blocks which correspond with reference numerals 70 and 80 it is typical and preferred that the sub-sets of the sub-series of electrically unacceptable microelectronic fabrication die only, which are electrically retested, comprise a single electrically unacceptable microelectronic fabrication die. However, the present invention also does not preclude simultaneous electrical retesting of a sub-set of the sub-series of electrically unacceptable microelectronic fabrication die which comprises multiple electrically unacceptable microelectronic fabrication die.

Referring again to FIG. 1, and in accord with the inquiry block which corresponds with reference numeral 90, there is determined if all electrically unacceptable die within the sub-series of electrically unacceptable microelectronic fabrication die have been electrically retested.

If all electrically unacceptable microelectronic fabrication die within the sub-series of electrically unacceptable microelectronic fabrication die have not been electrically retested, and in accord with a repetitive loop which includes the blocks which correspond with reference numerals 100, 80 and 90, the electrical probe head is sequentially and repetitively repositioned and electrical tests are sequentially and repetitively undertaken until such time as all of the sub-sets of the sub-series of electrically unacceptable microelectronic fabrication die within the sub-series of electrically unacceptable microelectronic fabrication die have been electrically retested. At such point in time, the preferred embodiment of the method of the present invention as illustrated in conjunction with the algorithmic flow diagram of FIG. 1 is stopped.

As is understood by a person skilled in the art, and although the algorithmic flow diagram of FIG. 1 generally illustrates the present invention within the context of: (1) a first electrical testing of each of a series of microelectronic fabrication die fabricated within a microelectronic fabrication substrate, prior to; (2) a second electrical retesting of each of a sub-series of electrically unacceptable microelectronic fabrication die within the series of microelectronic fabrication die fabricated within the microelectronic fabrication substrate, the present invention also contemplates than an electrically unacceptable microelectronic fabrication die within a sub-series of electrically unacceptable microelectronic fabrication substrate may be immediately electrically retested after an initial electrical test has determined the electrically unacceptable microelectronic fabrication die to be electrically unacceptable. Within the context of the present invention, however, within the present it is generally preferred, if not required, that an electrical probe head within an electrical test apparatus be repositioned with respect to each of a sub-series of electrically unacceptable microelectronic fabrication die prior to electrical retesting of each of the sub-series of electrically unacceptable microelectronic fabrication die. Such repositioning of the electrical probe head with respect to each of the sub-series of electrically unacceptable microelectronic fabrication die may be undertaken by a simple vertical re-registering of the electrical probe head with respect to an electrically unacceptable microelectronic fabrication die through an increase and decrease in vertical separation of the electrical probe head and electrically unacceptable microelectronic fabrication die without any lateral movement of the microelectronic fabrication substrate within which is fabricated the electrically unacceptable microelectronic fabrication die. In the alternative, such repositioning of the electrical probe head with respect to each of the sub-series of electrically unacceptable microelectronic fabrication die may be undertaken employing both a vertical re-registering of the electrical probe head with respect to the electrically unacceptable microelectronic fabrication die and a lateral re-indexing of the microelectronic fabrication substrate within which is fabricated the unacceptable microelectronic fabrication die.

As is understood by a person skilled in the art, within the context of the present invention, a repositioning of an electrical probe head with respect to an electrically unacceptable microelectronic fabrication die provides for greater accuracy when electrically retesting the electrically unacceptable microelectronic fabrication die insofar as such repositioning of the electrical probe head with respect to the electrically unacceptable microelectronic fabrication die will typically address electrical probe head probe contact deficiencies and electrical probe head misregistration deficiencies when electrically retesting an electrically unacceptable microelectronic fabrication die.

Similarly, and also in accord with the present invention, the present invention preferably provides that none of the electrically acceptable microelectronic fabrication die within the series of microelectronic fabrication die is electrically retested, but all of the sub-series of electrically unacceptable microelectronic fabrication die from within the series of microelectronic fabrication die is electrical probe retested, for a microelectronic substrate which may be reworked.

As is understood by a person skilled in the art, by electrically retesting only the series of electrically unacceptable microelectronic fabrication die, but not the series of electrically acceptable microelectronic fabrication die, and only when a microelectronic fabrication substrate may be reworked, there is provided enhanced efficiency when electrically testing a series of microelectronic fabrication die fabricated within a microelectronic fabrication substrate.

Thus, for reasons as noted above, the method of the present invention as outlined within the algorithmic flow diagram of FIG. 1 provides, in particular, for enhanced efficiency when electrically testing a series of microelectronic fabrication die fabricated within a microelectronic fabrication substrate.

Figure 2:
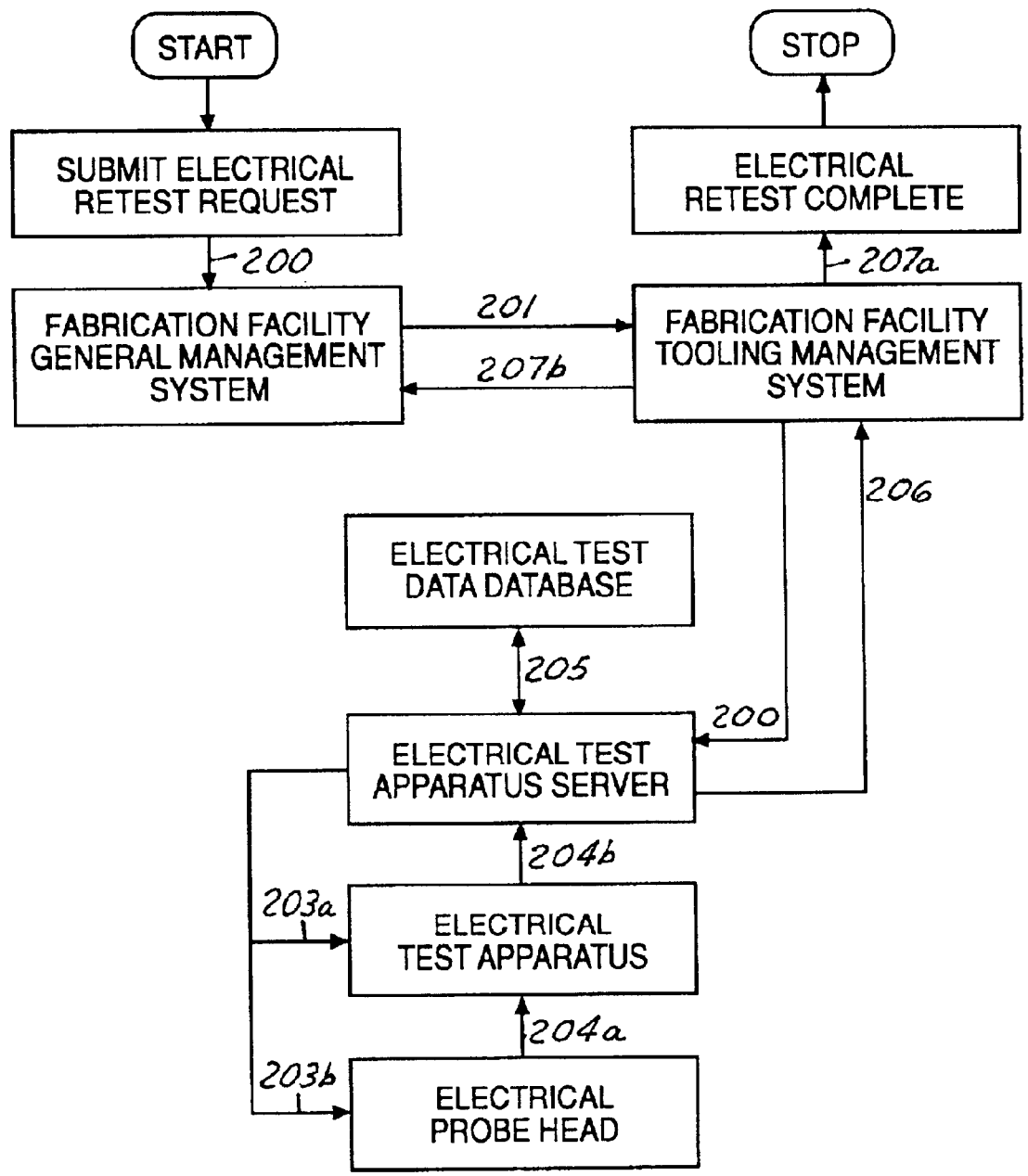
FIG. 2 shows a logistic flow diagram of microelectronic fabrication facility operation in accord with the algorithmic flow diagram of FIG. 1.

Referring now to FIG. 2, there is shown a logistic flow diagram illustrating, within a microelectronic fabrication facility, operation of the method of the present invention as illustrated within the algorithmic flow diagram of FIG. 1.

As is illustrated within the logistic flow diagram of FIG. 2, and in accord with the logistic flow arrow which corresponds with reference numeral 200, an electrical retest request is made for a series of electrically unacceptable microelectronic fabrication die within a microelectronic fabrication substrate which may be reworked. As is further illustrated within the logistic flow diagram of FIG. 2, and also in accord with the logistic flow arrow which corresponds with reference numeral 200, the electrical retest request is submitted to a fabrication facility general management system (which is typically and preferably a computer operated system).

Referring again to the logistic flow diagram of FIG. 2, and in accord with the logistic flow arrow which corresponds with reference numeral 201, the fabrication facility general management system submits a request to a fabrication facility tooling management system (which is typically and preferably also a computer operated system), for the electrical retest request of the series of electrically unacceptable microelectronic fabrication die only, within the microelectronic fabrication which may be reworked. In turn, and in accord with the logistic flow arrow which corresponds with reference numeral 202, the fabrication facility tooling management system submits the electrical retest request to an electrical test apparatus server, which finally in turn, and in accord with the logistic flow arrows which correspond with reference numerals 203a and 203b, forward the electrical retest request to an electrical test apparatus and an electrical probe head associated with the electrical test apparatus. Although not specifically illustrated within the logistic flow diagram of FIG. 2, the electrical probe head is then manipulated to retest only the series of electrically unacceptable microelectronic fabrication die within the microelectronic fabrication substrate which may be reworked, and for which electrical retesting has been requested.

Referring again to the logistic flow diagram of FIG. 2, and in accord with the logistic flow arrows which correspond with reference numerals 204a and 204b, electrical retest data is forwarded back to the electrical test apparatus server, where it is further forwarded to and merged with original electrical test data which is obtained from an electrical test data database, in accord with the logistic flow arrow corresponding with reference numeral 205. Further, in accord with the logistic flow arrow which corresponds with reference numeral 206, the merged original electrical test data and electrical retest data are forwarded back to the fabrication facility tooling management system and further in accord with the logistic flow arrows corresponding with reference numerals 207a and 207b the fabrication facility tooling management system indicates that the electrical retesting of only the series of electrically unacceptable microelectronic fabrication die within the microelectronic fabrication substrate which may be reworked has been completed.

As is understood by a person skilled-in the art, the preferred embodiment and example of the present invention are illustrative of the present invention rather than limiting of the present invention. Revisions and modifications may be made to methods, apparatus and systems which are employed within the context of the preferred embodiment and example of the present invention while still providing a method in accord with the present invention, further in accord with the accompanying claims.

What is claimed is:

1. A method for electrically testing a series of microelectronic fabrication die fabricated within a microelectronic fabrication substrate comprising:

providing a microelectronic fabrication substrate having fabricated therein a series of microelectronic fabrication die;

electrical testing the series of microelectronic fabrication die while employing an electrical test apparatus to thus determine from the series of microelectronic fabrication die at least one sub-series of electrically unacceptable microelectronic fabrication die;

determining whether the microelectronic fabrication substrate may be reworked; and electrically retesting within the microelectronic fabrication substrate only the at least one sub-series of electrically unacceptable microelectronic fabrication die, and only if the microelectronic fabrication substrate may be reworked.

2. The method of claim 1 wherein the microelectronic fabrication substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the electrical probe apparatus is a physical contact electrical probe apparatus.

4. The method of claim 1 wherein the electrical probe apparatus is a physical non-contact electrical probe apparatus.

5. The method of claim 1 wherein the microelectronic fabrication substrate is reindexed prior to electrically retesting an electrically unacceptable die within the at least one sub-series of electrically unacceptable microelectronic fabrication die.

6. The method of claim 1 wherein the microelectronic fabrication substrate is not reindexed prior to electrically retesting an electrically unacceptable die within the at least one sub-series of electrically unacceptable microelectronic fabrication die.

7. A method for electrically testing a series of semiconductor integrated circuit microelectronic fabrication die fabricated within a semiconductor substrate comprising:

providing a semiconductor substrate having fabricated therein a series of semiconductor integrated circuit microelectronic fabrication die;

electrical testing the series of semiconductor integrated circuit microelectronic fabrication die while employing an electrical test apparatus to thus determine from the series of semiconductor integrated circuit microelectronic fabrication die at least one sub-series of electrically unacceptable semiconductor integrated circuit microelectronic fabrication die;

determining whether the semiconductor substrate may be reworked; and electrically retesting within the semiconductor substrate only the at least one sub-series of electrically unacceptable semiconductor integrated circuit microelectronic fabrication die, and only if the semiconductor substrate may be reworked.

8. The method of claim 7 wherein the electrical probe apparatus is a physical contact electrical probe apparatus.

9. The method of claim 7 wherein the electrical probe apparatus is a physical non-contact electrical probe apparatus.

10. The method of claim 7 wherein the semiconductor substrate is reindexed prior to electrically retesting an electrically unacceptable semiconductor integrated circuit microelectronic fabrication die within the at least one sub-series of electrically unacceptable semiconductor integrated circuit microelectronic fabrication die.

11. The method of claim 7 wherein the semiconductor substrate is not reindexed prior to electrically retesting an electrically unacceptable semiconductor integrated circuit microelectronic fabrication die within the at least one sub-series of electrically unacceptable semiconductor integrated circuit microelectronic fabrication die.

* * * * *